(12) United States Patent
Kitamura

(10) Patent No.: US 7,627,846 B2
(45) Date of Patent: *Dec. 1, 2009

(54) METHOD AND APPARATUS FOR AUTOMATICALLY SHAPING TRACES ON SURFACE OF SUBSTRATE OF SEMICONDUCTOR PACKAGE BY USING COMPUTATION

(75) Inventor: Tamotsu Kitamura, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 125 days.

This patent is subject to a terminal disclaimer.

(21) Appl. No.: 11/723,724

(22) Filed: Mar. 21, 2007

(65) Prior Publication Data

US 2007/0238221 A1 Oct. 11, 2007

(30) Foreign Application Priority Data

Mar. 23, 2006 (JP) ............................. 2006-080581

(51) Int. Cl.
*G06F 17/50* (2006.01)

(52) U.S. Cl. .............................. 716/11; 716/10; 716/12; 716/15

(58) Field of Classification Search ........................ None
See application file for complete search history.

(56) References Cited

U.S. PATENT DOCUMENTS

| | | | |
|---|---|---|---|
| 5,644,500 A | 7/1997 | Miura et al. | |
| 6,226,560 B1 * | 5/2001 | Hama et al. | 700/97 |
| 6,330,707 B1 | 12/2001 | Shinomiya et al. | |
| 6,596,549 B2 * | 7/2003 | Kitamura et al. | 438/6 |
| 6,609,237 B1 | 8/2003 | Hamawaki et al. | |
| 6,662,351 B2 * | 12/2003 | Kitamura et al. | 716/11 |
| 7,017,137 B2 * | 3/2006 | Wadland et al. | 716/13 |

(Continued)

FOREIGN PATENT DOCUMENTS

JP 5-055305 3/1993

(Continued)

OTHER PUBLICATIONS

"An operating method of an integrated printed-circuit board CAD tool", Design Wave Magazine, CQ Publishing Co., Ltd. pp. 51-56. Jun. 2003.

*Primary Examiner*—Leigh Marie Garbowski
(74) *Attorney, Agent, or Firm*—Staas & Halsey LLP

(57) ABSTRACT

A method and an apparatus for automatically shaping traces by using computation comprises: setting means that sets an equiangular octagon circumscribing a clearance circle indicating a position where clearance can be secured from vias so that one side of such equiangular octagon is in parallel with a reference line; setting means that sets, with respect to the existing trace having a segment passing between the vias, an equiangular octagon circumscribing a circle that is centered on a center position of the via in the closest vicinity of such segment and that is tangent to such segment so that one side of such equiangular octagon is in parallel with the reference line; correction means that corrects the existing trace in the vicinity of the via so that the trace overlaps any side of the equiangular octagon set with respect to such via; and correction means that connects two segments obtained by the correction means by a segment in a direction of "45×n" degrees with respect to the reference line.

11 Claims, 16 Drawing Sheets

U.S. PATENT DOCUMENTS

| | | | |
|---|---|---|---|
| 7,191,415 B2* | 3/2007 | Kitamura et al. | 716/5 |
| 2002/0028573 A1 | 3/2002 | Kitamura et al. | |
| 2006/0071322 A1* | 4/2006 | Kitamura | 257/692 |
| 2006/0271898 A1* | 11/2006 | Kitamura | 716/12 |
| 2008/0022234 A1* | 1/2008 | Kitamura | 716/2 |

FOREIGN PATENT DOCUMENTS

| | | |
|---|---|---|
| JP | 9-069118 | 3/1997 |
| JP | 10-209288 | 8/1998 |
| JP | 11-161694 | 6/1999 |
| JP | 2001-044288 | 2/2001 |
| JP | 2001-350813 | 12/2001 |
| JP | 2002-083006 | 3/2002 |

* cited by examiner

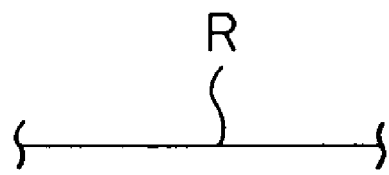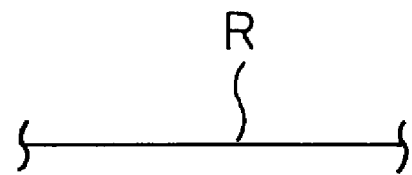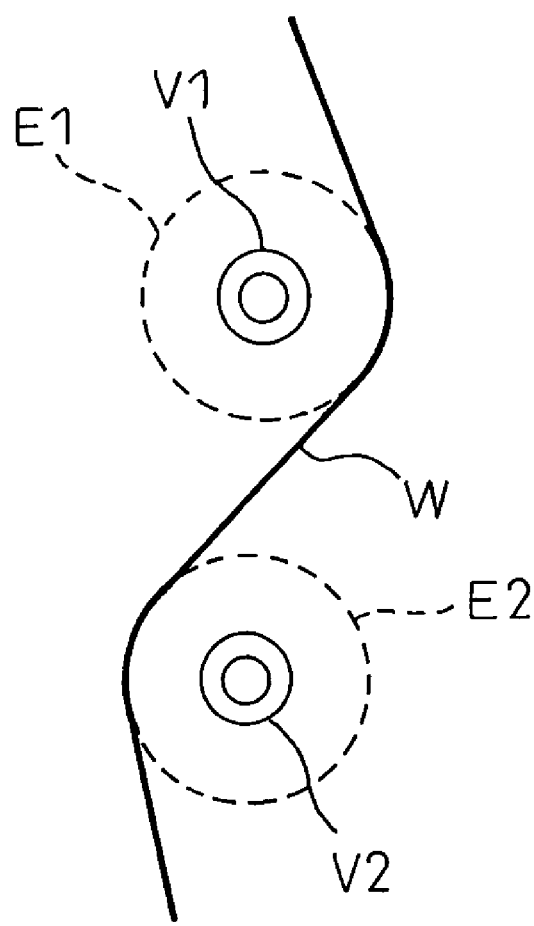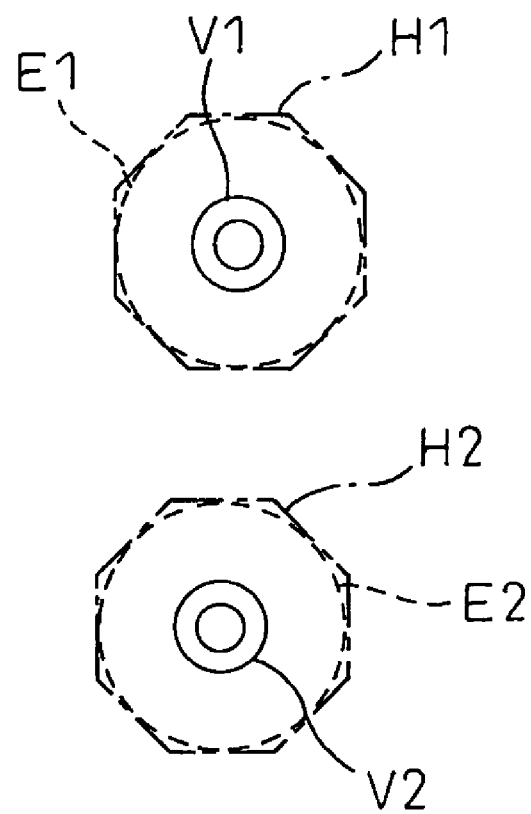

Fig.9A
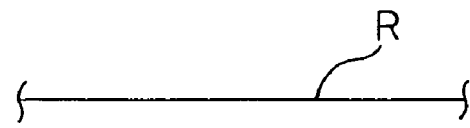
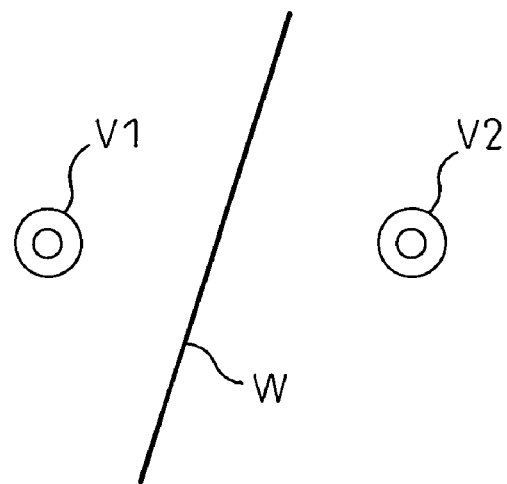
Fig.9B
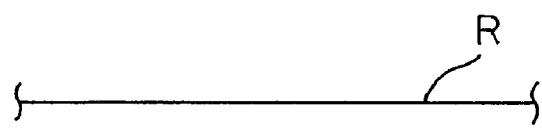
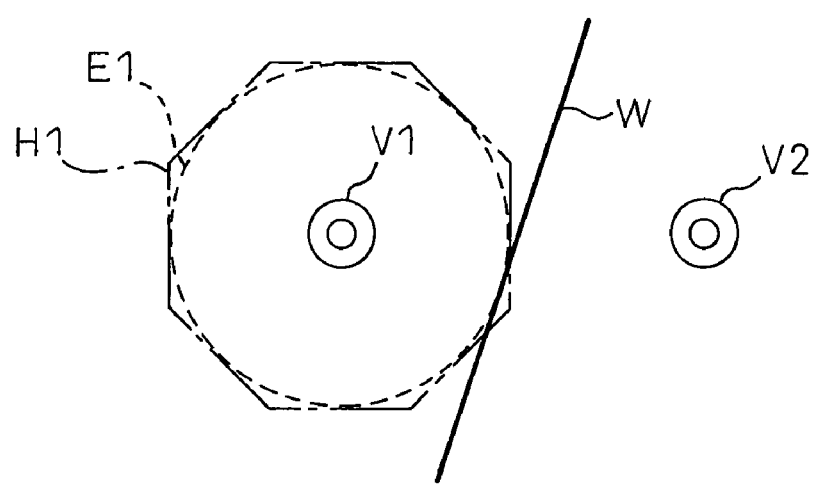

CONNECT BY SEGMENT IN DIRECTION OF 45 DEGREES

CONNECT BY SEGMENT IN DIRECTION OF 135 DEGREES

CONNECT BY SEGMENT IN DIRECTION OF 0 DEGREES

CONNECT BY SEGMENT IN DIRECTION OF 90 DEGREES

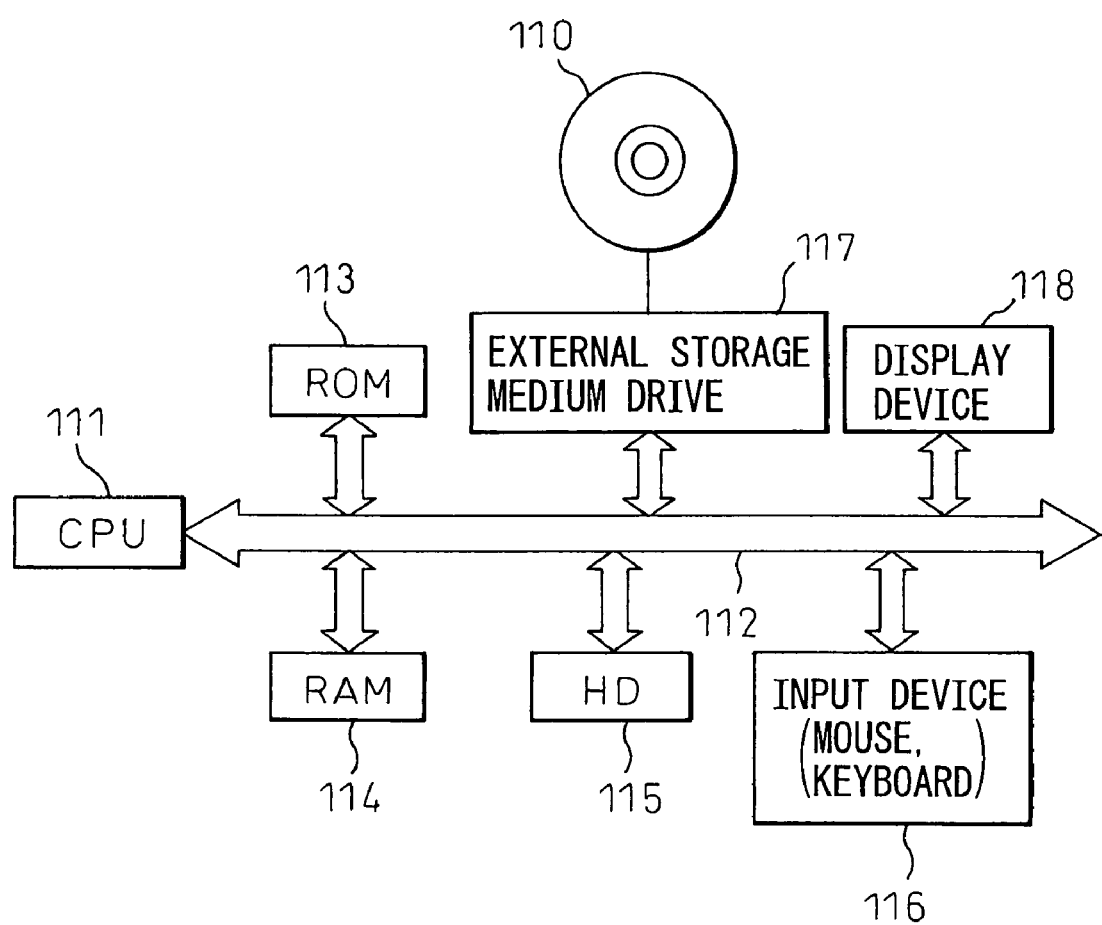

METHOD AND APPARATUS FOR AUTOMATICALLY SHAPING TRACES ON SURFACE OF SUBSTRATE OF SEMICONDUCTOR PACKAGE BY USING COMPUTATION

BACKGROUND OF THE INVENTION

1. Field of the Invention

The present invention relates to an automatic trace shaping method and an automatic trace shaping apparatus for automatically shaping existing traces consisting of straight and/or curved lines that are designed to be disposed in arbitrary directions, on a surface of a substrate of a semiconductor package, into traces each consisting of a combination of segments in predetermined directions by using computation.

2. Description of the Related Art

In LSI (Large-scale integration), PCB (Printed-circuit board) and the like as manufacturing, for example, set forth in Jono, "An operating method of an integrated printed-circuit board CAD tool", Design Wave Magazine, CQ Publishing Co., Ltd., June 2003, pp. 51-56, it is typical that a trace is comprised of a plurality of straight line segments and the trace is designed so that these segments lie in directions of 90 or 45 degrees with respect to a predetermined reference line. In the LSI and the PCB that have pattern characteristics in that there are relatively large spaces around the traces and disposed positions and shapes of obstacles have certain regularity, the traces in the LSI, the PCB and the like can be easily designed according to design rules that allow computation by a computer and, therefore, several automatic wiring methods have already been proposed.

For example, as a typical example of the automatic wiring methods for the LSI and the PCB, there is a method called a labyrinth search method as set forth in Japanese Unexamined Patent Publication No. 11-161694, Japanese Unexamined Patent Publication No. 2001-350813, Japanese Unexamined Patent Publication No. 2001-044288, and Japanese Unexamined Patent Publication No. 10-209288. In this labyrinth search method, trace routes on a substrate are set so as to secure clearance from obstacles and so as not to intersect the obstacles by bypassing such obstacles in the directions of 90 degrees or, in some cases, 45 degrees.

In contrast to this, on substrates of semiconductor integrated circuit mounting packages (hereinafter simply referred to as the "semiconductor packages") such as PBGA, EBGA and the like, there exist a large number of elements, such as planes, gates, marks, internal components or other traces in the packages and so on that may obstruct the traces and shapes and the disposed positions or angles of such obstacles may vary significantly. Further, vias, balls, bonding pads (B/P), flip chip pads (F/C) or the like, which are to be starting or end points of the traces, may be positioned variously and, moreover, sufficient spaces often cannot be secured around the traces. Therefore, in trace design of the semiconductor packages, traces are often disposed in directions of arbitrary angles on the surface of the substrate of the semiconductor package. In the trace design of the semiconductor packages, a designer typically designs the trace routes of the semiconductor packages on a virtual plane by trial and error depending on the designer's skill, experience and intuition and, for example, by using a CAD system.

As a trace design method of the semiconductor packages, for example, Japanese Unexamined Patent Publication No. 2002-083006 describes an automatic wiring method that uses a CAD system for generating, by automatic computation, trace shapes satisfying design rules, for example, by generating circular arcs around vias according to the design rules and combining the traces based on tangents of the circular arcs.

Further, for example, Japanese Unexamined Patent Publication No. 09-069118 describes a semi-automatic wiring method that does not rely on automatic computation but generates an outlined route manually and determines an optimal route when semiconductor elements other than two or more semiconductor elements between which a trace route is intended to be set are assumed to be obstacles.

Still further, for example, Japanese Unexamined Patent Publication No. 05-055305 describes a trace design method of semiconductor packages that implements traces in directions of specific angles.

As described above, when the traces in arbitrary directions (at arbitrary angles), that is to say, for example, the traces comprised of straight and/or curved lines, are designed in the semiconductor packages, a CAD for the semiconductor packages that complies with such trace design is typically used. In contrast to this, a CAD for the LSI is good at designing the traces each consisting of a combination of segments in the direction of "45×n" degrees (where n is an integer) with respect to a predetermined reference line (hereinafter also referred to as the "45-degree traces" or the "inclined 45-degree traces") but weak in designing the traces in the arbitrary directions and the curved traces. In other words, there is no compatibility between trace design data designed by the CAD for the semiconductor packages and that designed by the CAD for the LSI. In reality, the traces in the circuit boards are often designed by using the CAD for the LSI and, in this case, even though the trace design for the semiconductor packages has already been completed, the traces have to be redesigned so that the trace design can be utilized also in the CAD for the LSI.

Further, in order to implement the 45-degree traces described above by using the CAD for the semiconductor packages, the designer has to set the direction in which the traces can be disposed at 45 degrees on the CAD software for the semiconductor packages and, then, while viewing a display screen, has to manually design each segment or each trace one by one by trial and error so as to satisfy requirements for clearance (lines and spaces). Traces on the surface of the substrate of the semiconductor packages are very dense and it is difficult to secure the sufficient spaces around the traces and, therefore, it has to be said that it is difficult, in itself, to implement the 45-degree traces.

In the manual trace design by trial and error as described above, as the required traces become more complicated, the effort, time and difficulty for achieving the optimal traces is increased. Further, unevenness in quality of finished products in which the traces have been designed is also increased. In reality, because the manual trace design by trial and error requires about 3-10 days for one product and it is not economical to waste further time for trace designing, the designer has to compromise with a certain design quality.

In view of the above problems, it is an object of the present invention to provide an automatic trace shaping method and an automatic trace shaping apparatus that can automatically shape existing traces consisting of straight and/or curved lines that are designed to be disposed in arbitrary directions on a surface of a substrate of a semiconductor package into traces each consisting of a combination of only segments having specific angles with respect to a predetermined reference line.

SUMMARY OF THE INVENTION

In order to achieve the above object, according to the present invention, by using an arithmetic processing unit such as a computer, equiangular polygons each having sides in parallel with a predetermined reference line are set with respect to existing traces consisting of straight and/or curved lines that are designed to be disposed in arbitrary directions on a surface of a substrate of a semiconductor package and, then, by correcting positions of the existing traces so that each existing trace overlaps any side of the equiangular polygons, the existing traces consisting of the straight and/or curved lines that are designed to be disposed in the arbitrary directions are shaped into traces each consisting of a combination of only segments having specific angles with respect to the predetermined reference line.

In particular, 45-degree traces can be obtained as follows. In an automatic trace shaping method according to the present invention that automatically shapes existing traces consisting of straight and/or curved lines that are designed to be disposed in arbitrary directions on a surface of a substrate of a semiconductor package into traces each consisting of a combination of segments in directions of "45×n" degrees (where n is an integer) with respect to a predetermined reference line by using computation, by setting equiangular octagons having sides in parallel with the predetermined reference line and, then, correcting positions of the existing traces so that each existing trace overlaps any side of the equiangular octagons, the existing traces that are designed to be disposed in the arbitrary directions are shaped into the traces each consisting of the combination of the segments in the directions of "45×n" degrees (where n is an integer).

Here, the predetermined reference line refers to one of four contour sides of the semiconductor package from which the existing traces to be shaped are drawn out. Each interior angle of the equiangular octagons is 135 degrees and the equiangular octagons are set in the following two manners. Thus, each equiangular octagon is set so as to circumscribe either (1) a clearance circle indicating a position where clearance can be secured from vias or obstacles, or (2) with respect to the existing trace having a segment passing between the vias, between the obstacles or between the via and the obstacle adjacent to each other, a circle that is centered on a center position of the via or the obstacle existing at the closest position to such segment and that is tangent to such segment.

FIG. 1 is a principle block diagram of an automatic trace shaping apparatus according to the present invention. Hereinafter, like reference numerals designate elements having like functions throughout the several views.

An automatic trace shaping apparatus 1 according to the present invention that automatically shapes existing traces consisting of straight and/or curved lines that are designed to be disposed in arbitrary directions on a surface of a substrate of a semiconductor package into traces each consisting of a combination of segments in directions of "45×n" degrees (where n is an integer) with respect to a predetermined reference line by using computation comprises: first setting means 11 that sets an equiangular octagon circumscribing a clearance circle indicating a position where clearance can be secured from vias or obstacles so that one side of this equiangular octagon is in parallel with the predetermined reference line; second setting means 12 that sets, with respect to the existing trace having a segment passing between the vias, between the obstacles or between the via and the obstacle adjacent to each other, an equiangular octagon circumscribing a circle that is centered on a center position of the via or the obstacle existing at the closest position to such segment and that is tangent to such segment so that one side of this equiangular octagon is in parallel with the predetermined reference line; first correction means 13 that corrects the existing trace in the vicinity of the via or the obstacle so that the trace overlaps any side of the equiangular octagon set by the first setting means 11 or the second setting means 12 with respect to such via or obstacle; and second correction means 14 that connects two segments obtained when the first correction means 13 corrects the existing trace based on the equiangular octagons adjacent to each other substantially in a disposing direction of the existing trace by a segment in a direction of "45×n" degrees (where n is an integer) with respect to the predetermined reference line. Then, the automatic trace shaping apparatus 1 according to the present invention determines the trace consisting of a combination of the above-mentioned two segments obtained by the first correction means 11 and the above-mentioned segment in the direction of "45×n" degrees (where n is an integer) obtained by the second correction means 12 as the trace after the correction. Here, the predetermined reference line refers to one of four contour sides of the semiconductor package from which the existing traces to be shaped are drawn out.

In this connection, the means 11-14 in the automatic trace shaping apparatus 1 can be implemented in the form of a software program that can be operated by an arithmetic processing unit such as a computer. An apparatus for performing the above-mentioned processes and a program for allowing the computer to perform the above-mentioned processes can be implemented easily by those skilled in the art who understand the following description. Further, it is evident to those skilled in the art that the program for allowing the computer to perform the above-mentioned processes may be stored in storage media.

BRIEF DESCRIPTION OF THE DRAWINGS

The present invention will be more clearly understood from the description as set below with reference to the accompanying drawings, wherein:

FIGS. 8A and 8B are diagrams for describing a setting of equiangular octagons with respect to clearance circles in an embodiment of the present invention;

FIGS. 9A and 9B are diagrams for describing an equiangular octagon that is set with respect to an existing trace having a segment passing between vias that are adjacent to each other in an embodiment of the present invention;

FIG. 16 is a block diagram showing a configuration of an automatic trace shaping apparatus of an embodiment of the present invention that operates according to a program that is stored on a storage medium.

DESCRIPTION OF THE PREFERRED EMBODIMENTS

Figure 1:
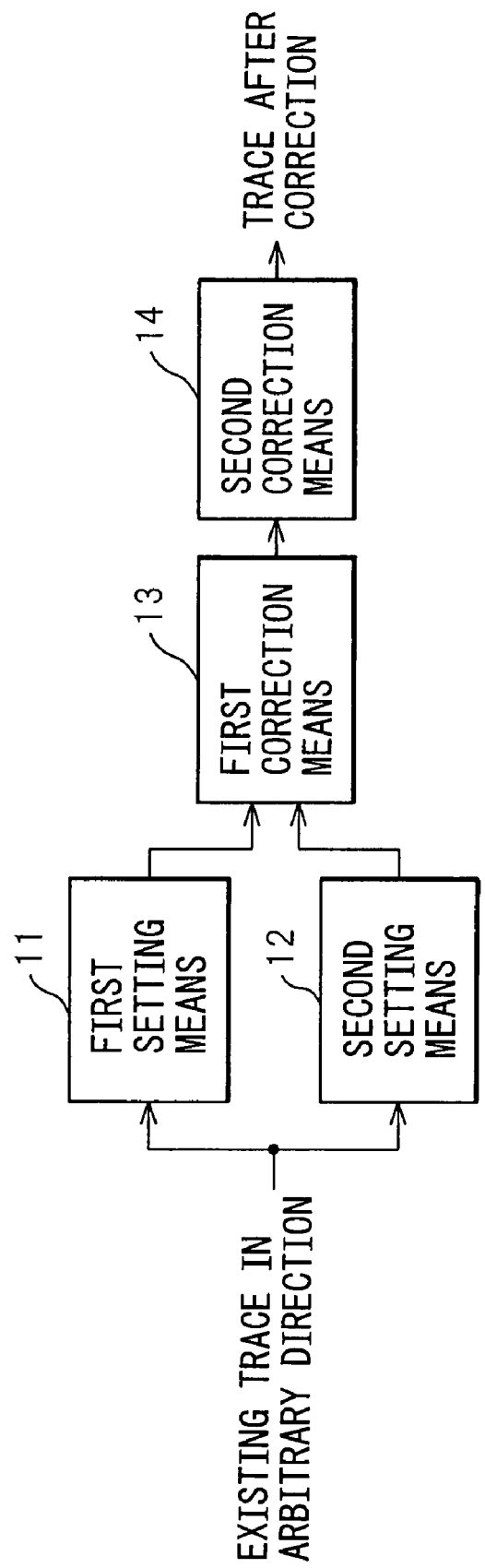
FIG. 1 is a principle block diagram of an automatic trace shaping apparatus according to the present invention.
Figure 2:
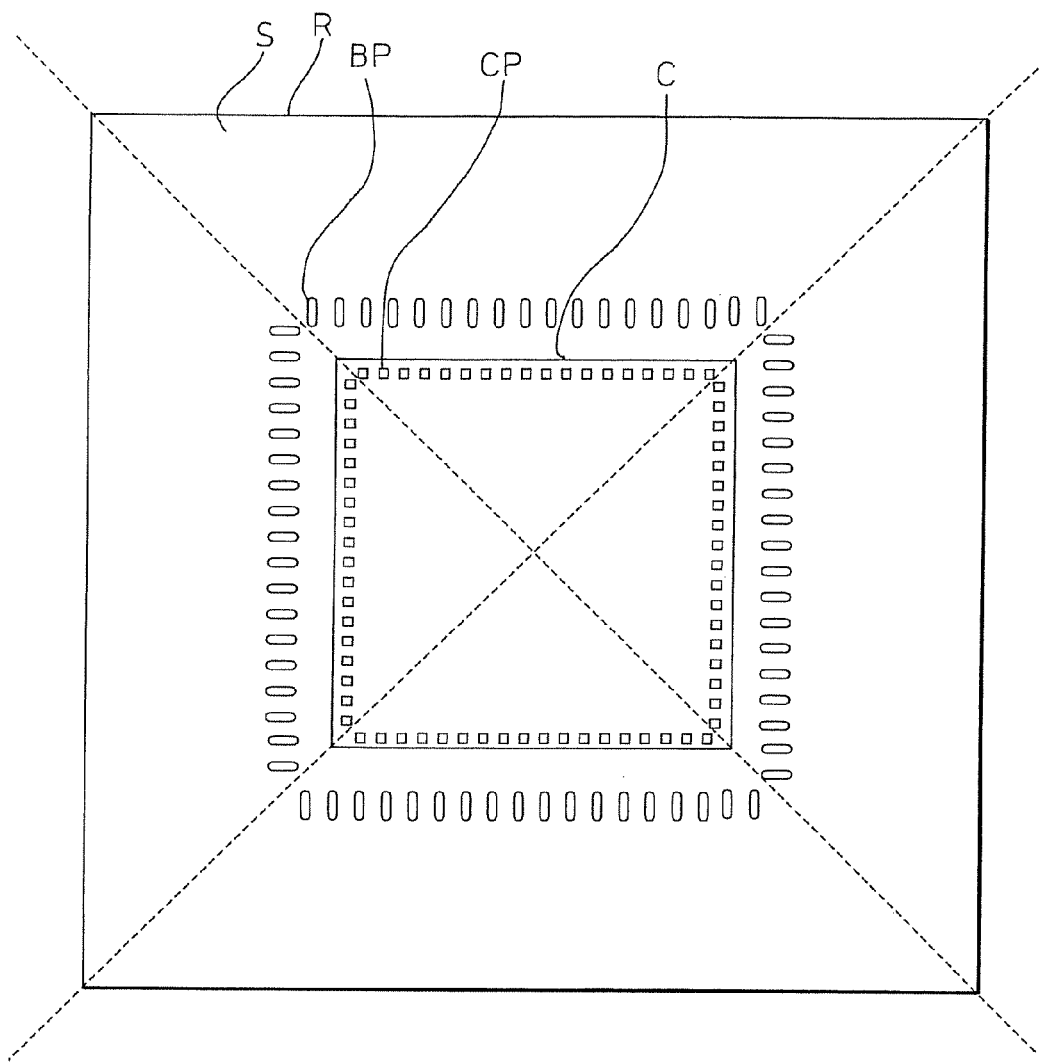
FIG. 2 is a diagram showing an exemplary arrangement of bonding pads on a surface of a substrate of a semiconductor package.

Before describing embodiments of the present invention, traces on a surface of a substrate of a semiconductor package will be briefly described. FIG. 2 is a diagram showing an exemplary arrangement of bonding pads on a surface of a substrate of a semiconductor package. A semiconductor chip C is mounted about the center of the surface of the substrate of the semiconductor package S. The semiconductor chip C has a quadrilateral shape and chip pads CP are also arranged to form the quadrilateral shape.

Here, the surface of the substrate of the semiconductor package S is considered by dividing it into four regions by diagonal lines on the surface of the substrate of the semiconductor package S or, in other words, boundary lines shown by dotted lines in the figure. The chip pads CP that are arranged in a line in the neighborhood of a contour (or, in other words, an edge) of the quadrilateral semiconductor chip C are each connected with the respective bonding pads BP that belong to the same region as that of such chip pads CP arranged in a line via respective traces (not shown). Further, traces (not shown) are provided from the bonding pads BP that are similarly arranged in a line toward a contour R (or, in other words, an edge) of the semiconductor package S that belongs to the same region as that of such bonding pads BP arranged in a line. In an edge portion of the semiconductor package S, plated leads (not shown) are drawn out in a direction orthogonal to the contour R of the semiconductor package S. Here, the plated leads may not be provided in the edge portion of the semiconductor package S and, in this case, the traces themselves are provided in the direction orthogonal to the contour R of the semiconductor package S in the edge portion of the semiconductor package S. In an embodiment of the present invention described below, though an automatic trace shaping process in one of the four regions described with reference to FIG. 2 will be described, this process can be applied similarly to the other three regions.

As an embodiment of the present invention, here will be described a process for shaping existing traces consisting of straight and/or curved lines that are designed to be disposed in arbitrary directions on a surface of a substrate of a semiconductor package into traces each consisting of a combination of segments of angles of "45×n" degrees (where n is an integer) with respect to a predetermined reference line (so-called "inclined 45-degree traces). In this case, equiangular octagons each having sides in parallel with the predetermined reference line are set and positions of the existing traces are corrected so that the traces can overlap any sides of the equiangular octagons. In the present invention, the equiangular octagons are used for shaping the traces because all interior angles of the equiangular octagons are 135 degrees and, if each trace is set so as to overlap any side of the equiangular octagons, the traces will always be oriented in directions of "45×n" degrees (where n is an integer.)

Figure 3:
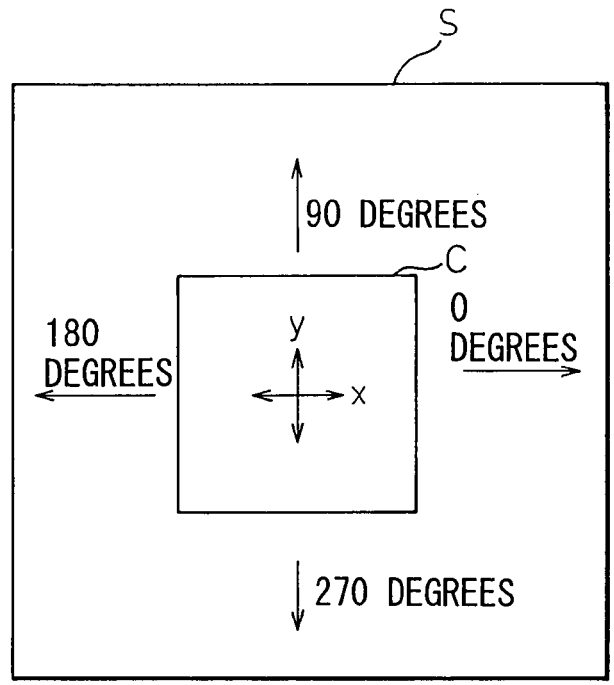
FIG. 3 is a diagram defining coordinate axes used in an embodiment of the present invention.

FIG. 3 is a diagram defining coordinate axes used in an embodiment of the present invention, and FIGS. 4A-4E are diagrams defining directions of traces in an embodiment of the present invention. In this embodiment, xy coordinate axes are defined on a surface of a substrate of a semiconductor package S as shown in the figure. Then, the directions of the traces on the surface of the substrate of the semiconductor package S are defined so that the positive direction on the x axis is the direction of 0 degrees, the positive direction on the y axis is the direction of 90 degrees, the negative direction on the x axis is the direction of 180 degrees, and the negative direction on the y axis is the direction of 270 degrees.

Figure 4A:
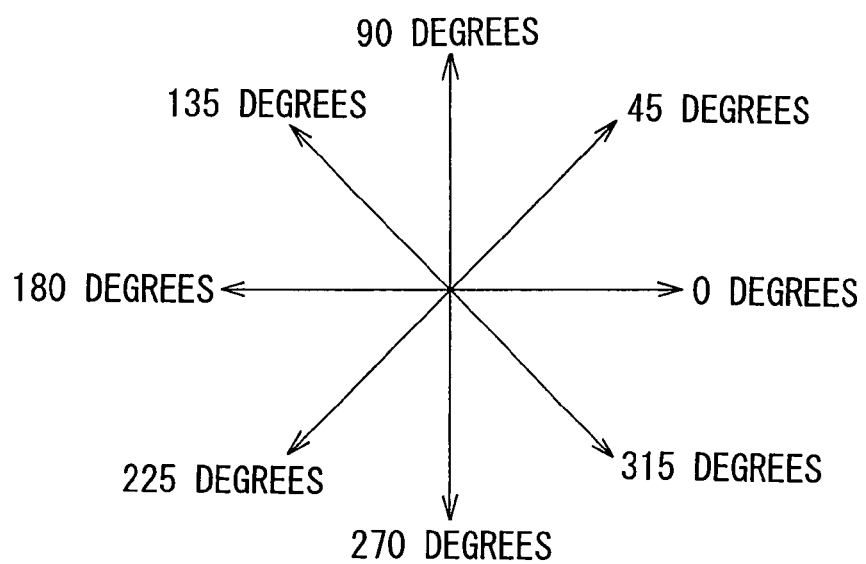
FIGS. 4A-4E are diagrams defining directions of traces in an embodiment of the present invention.
Figure 4B:
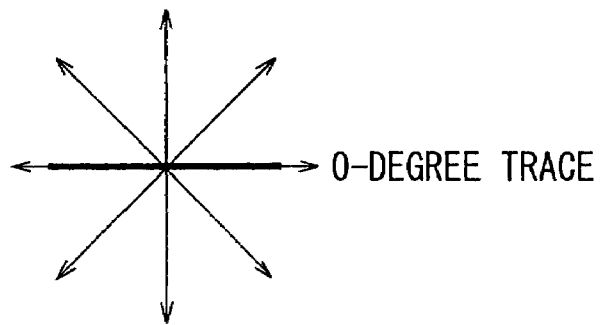
Figure 4C:
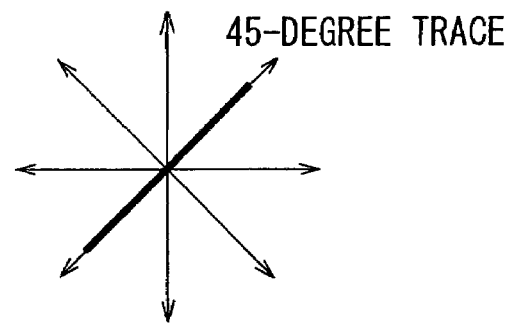
Figure 4D:
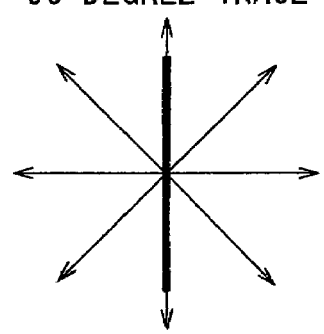
Figure 4E:
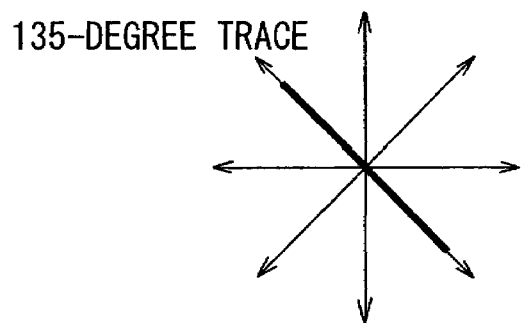

Here, when the predetermined reference line mentioned above is oriented in the direction of 0 degrees, the traces provided to be disposed in the directions of "45×n" degrees (where n is an integer) are substantially classified into the 0-degree traces as shown in FIG. 4B, the 45-degree traces as shown in FIG. 4C, the 90-degree traces as shown in FIG. 4D, and the 135-degree traces as shown in FIG. 4E. Here, it is to be noted that the 135-degree traces are generally considered to have the same quality as the 45-degree traces (the inclined 45-degree traces). In the embodiment of the present invention, the predetermined reference line mentioned above is set on one of four contour sides of the semiconductor package from which the existing traces to be shaped are drawn out.

Figure 5:
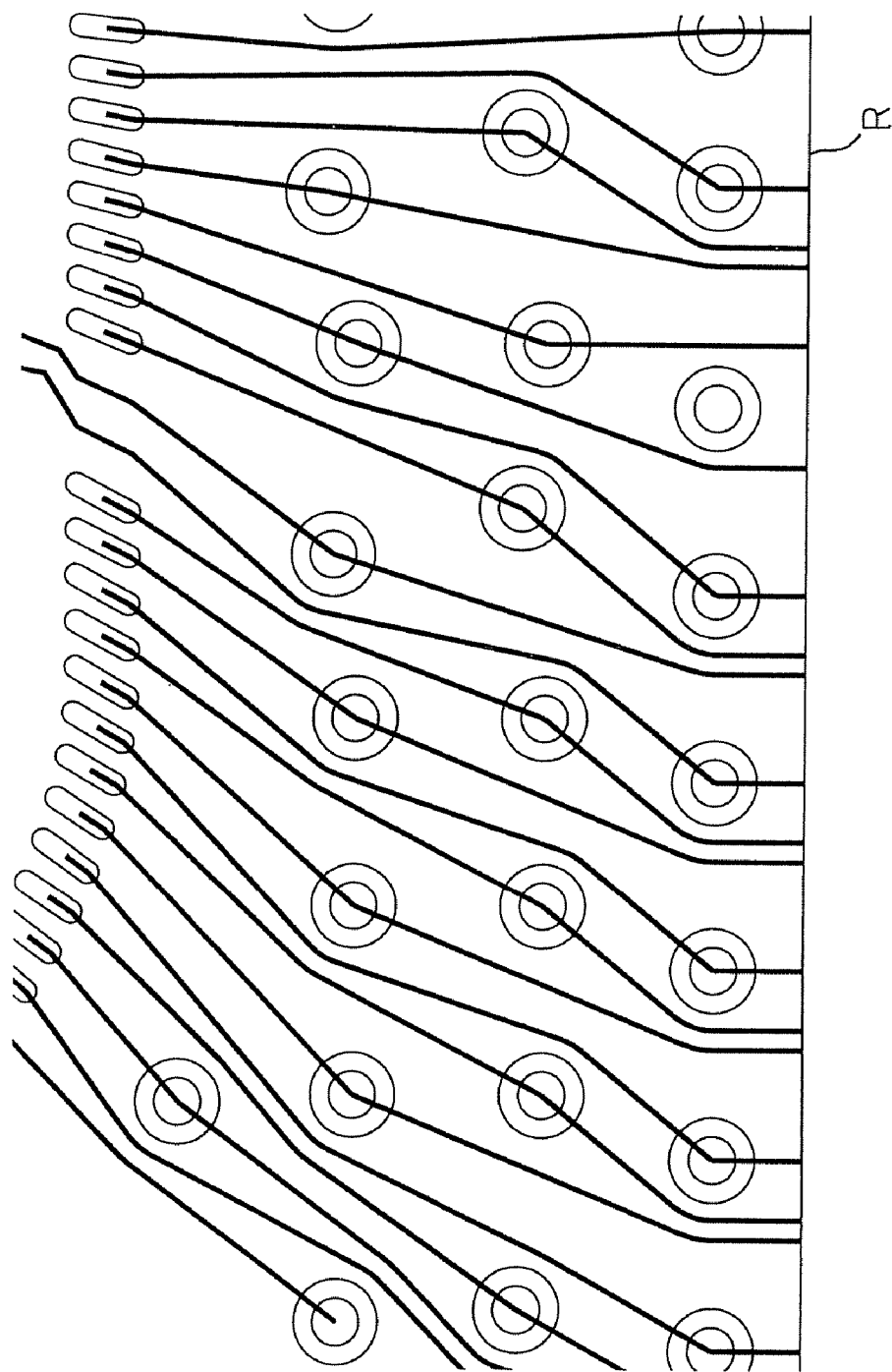
FIG. 5 is a diagram showing exemplary existing traces consisting of straight and/or curved lines that are designed to be disposed in arbitrary directions on a surface of a substrate of a semiconductor package.
Figure 6:
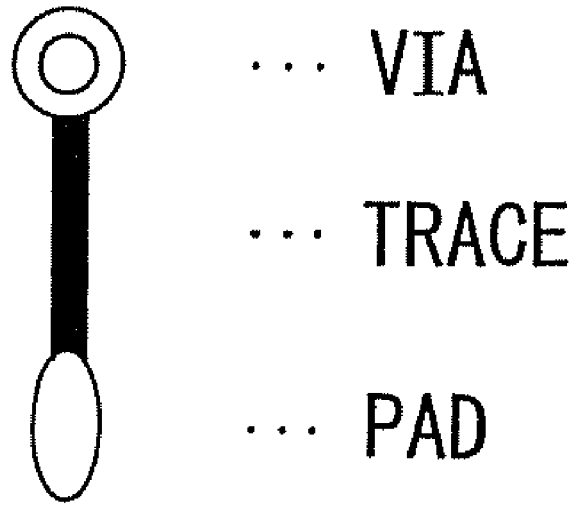
FIG. 6 is a diagram for describing legends of symbols for vias, bonding pads and traces indicated in the figures attached to this specification.

In the embodiment of the present invention, it is assumed that the existing traces consisting of the straight and/or curved lines are designed to be disposed in the arbitrary directions on the surface of the substrate of the semiconductor package and designed so that clearance can be secured from other existing traces, vias or obstacles adjacent to such existing traces. An example of such existing traces is shown in FIG. 5. FIG. 5 is a diagram showing the exemplary existing traces consisting of the straight and/or curved lines that are designed to be disposed in the arbitrary directions on the surface of the substrate of the semiconductor package. Hereinafter, traces shown in the accompanying figures are at least portions of the traces on the surface of the substrate of the semiconductor package. Further, FIG. 6 is a diagram for describing legends of symbols for vias, bonding pads and traces indicated in the figures attached to this specification. Hereinafter, the legends of FIG. 6 are applied to the figures indicating the vias, the bonding pads and/or the traces. As shown in FIG. 5, the existing traces each consisting of a combination of the straight and curved lines are disposed from the bonding pads arranged in a line toward the contour of the semiconductor package in the arbitrary directions (or, in other words, at arbitrary angles). The existing traces are disposed so that they are orthogonal to the contour R of the semiconductor package. Further, in order to avoid intersection with the vias the connection with which is unnecessary, the traces near such vias consist of curved lines.

Figure 7A:
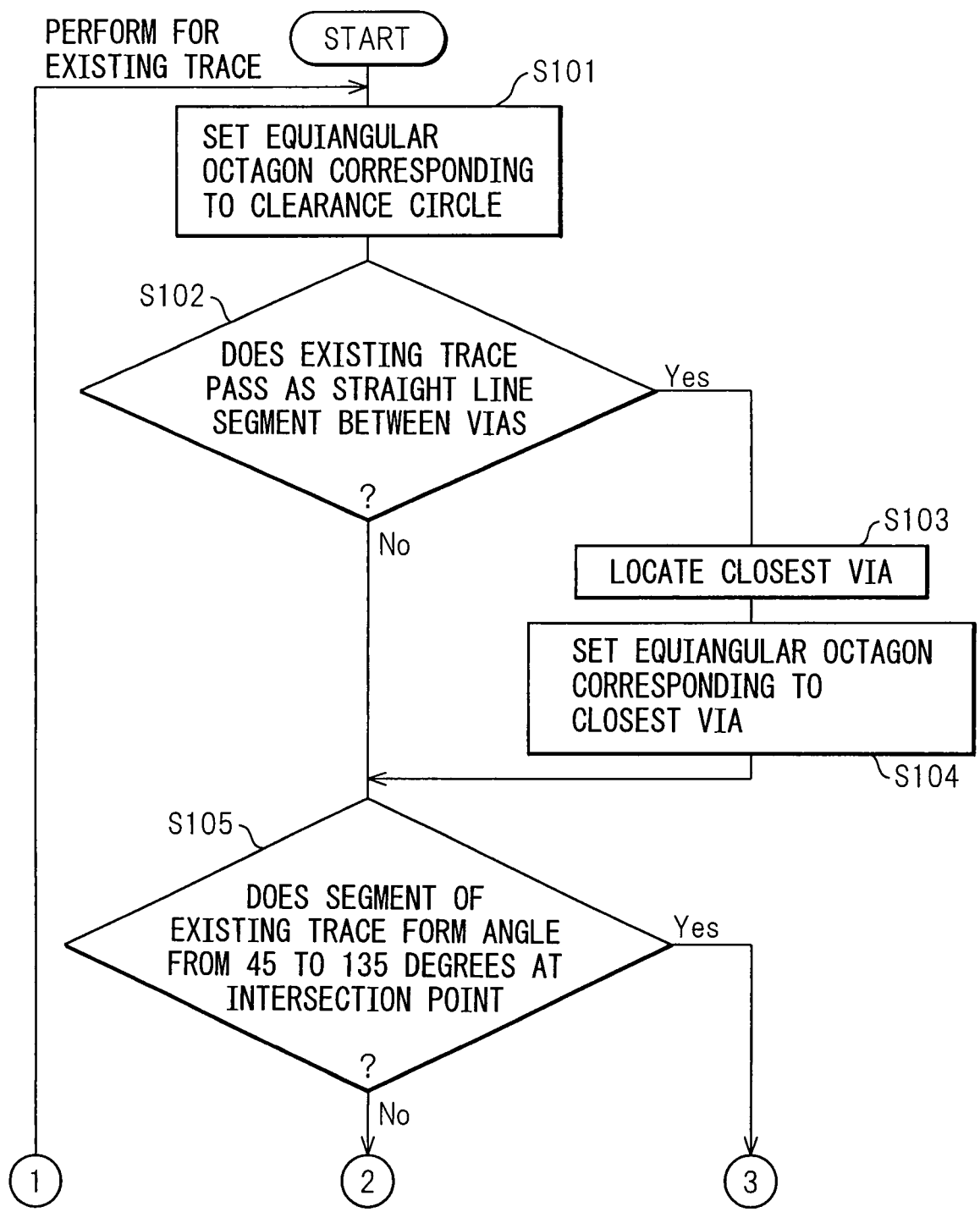
FIGS. 7A and 7B are flow charts showing an operational flow of an automatic trace shaping method according to an embodiment of the present invention.
Figure 7B:
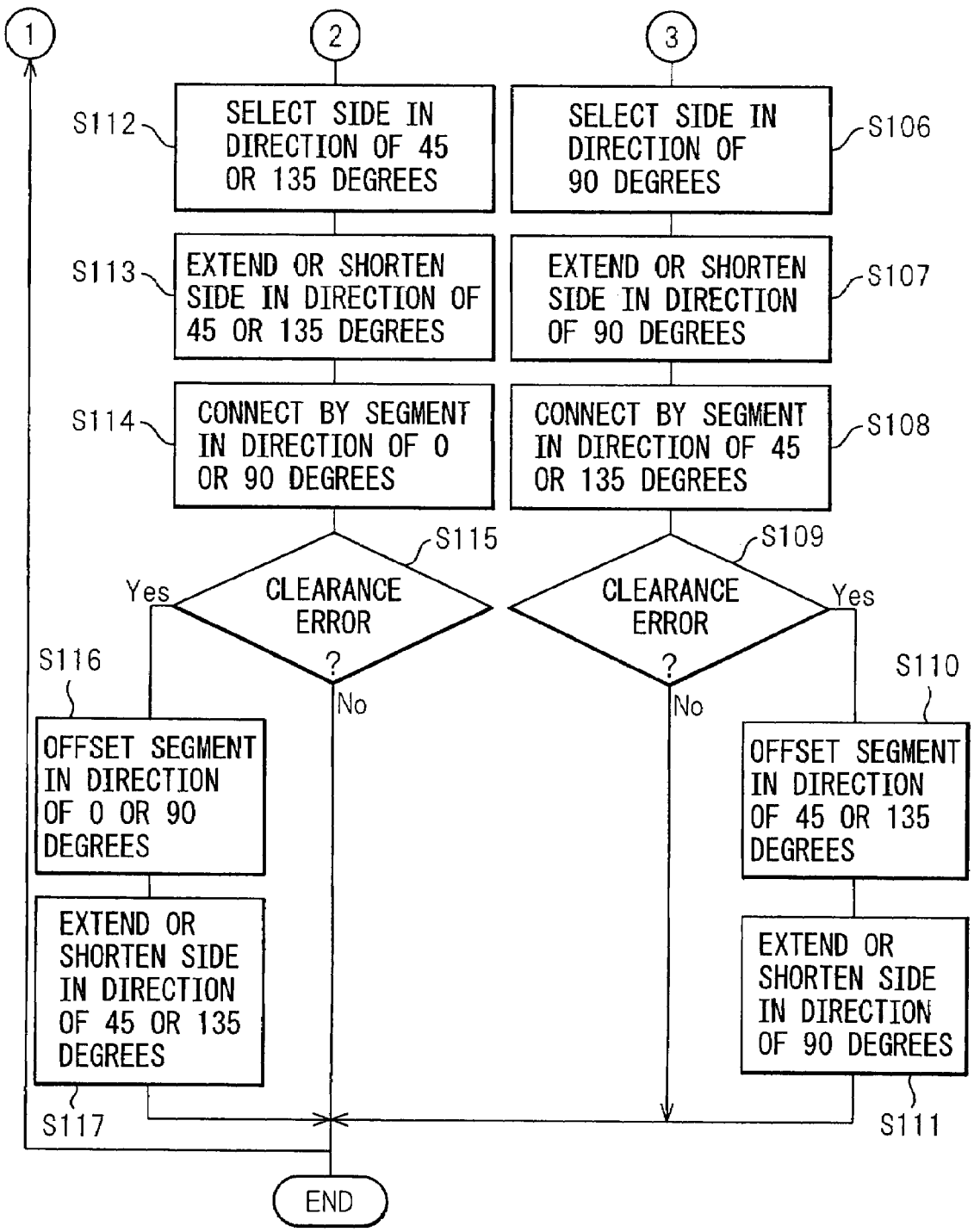

FIGS. 7A and 7B are flow charts showing an operational flow of an automatic trace shaping method according to the embodiment of the present invention.

In step S101, equiangular octagons each circumscribing a corresponding clearance circle, which indicates a position where clearance can be secured from vias or obstacles, are set so that one side of each of such equiangular octagons is in parallel with a predetermined reference line. As described above, in the embodiment of the present invention, the predetermined reference line mentioned above is set on one of the four sides of the semiconductor package from which the existing traces to be shaped are drawn out and, in the process of the following steps, the "predetermined reference line" means this contour of the semiconductor package. Here, it is to be noted that the equiangular octagons each circumscribing the corresponding circle are regular octagons.

FIGS. 8A and 8B are diagrams for describing a setting of the equiangular octagons with respect to the clearance circles in the embodiment of the present invention. Here, as shown in FIG. 8A, it is assumed that clearance circles E1 and E2 indicating positions where clearance can be secured from vias V1 and V2, respectively, are shown by dotted circles and an existing trace W passing between the vias V1 and V2 is disposed so as to overlap the clearance circles E1 and E2 near these vias V1 and V2, respectively. Therefore, in this case, the existing trace W has a curved shape near the vias V1 and V2. At this time, as shown in FIG. 8B, with respect to the via V1, an equiangular octagon H1 is set so that the equiangular octagon H1 circumscribes the clearance circle E1 indicating the position where the clearance from the via V1 can be secured and so that one side of the equiangular octagon H1 is in parallel with the contour line R of the semiconductor package. Further, as shown in FIG. 8B, with respect to the via V2, an equiangular octagon H2 is set so that the equiangular octagon H2 circumscribes the clearance circle E2 indicating the position where the clearance from the via V2 can be secured and so that one side of the equiangular octagon H2 is in parallel with the contour line R of the semiconductor package. Here, the reason why each equiangular octagon is set so that its one side is in parallel with the contour line of the semiconductor package is because the plated leads are provided to be orthogonal to the contour R of the semiconductor package as described above and, therefore, the equiangular octagons that are used for implementing the 45-degree traces following the plated leads also have to be set in an orientation corresponding to the angles of the traces and, moreover, if the orientations of the set equiangular octagons are not identical to each other, the 45-degree traces cannot be implemented across the entire surface of the substrate after all.

In this connection, in the example shown in FIG. 8A, in which the existing trace W is disposed so as to overlap the clearance circles E1 and E2 near the vias V1 and V2, respectively, the existing trace W in this neighborhood is comprised of circular arcs and, therefore, in other words, it can also be said that the clearance circles E1 and E2 are comprised of circles restored from these circular arcs. Here, it is to be noted that the position of the existing trace disposed to overlap the clearance circles is changed so as to overlap any side of the corresponding equiangular octagon according to the present invention, but this change of the position is not so significant in itself because the equiangular octagons are set to circumscribe the respective clearance circles.

Returning to FIG. 7A, in step S102, it is determined whether there is a straight existing trace passing between the vias, between the obstacles or between the via and the obstacle adjacent to each other or not, or, in other words, whether the existing trace passes between them not as a curve but as a straight line segment or not. If it is determined that the existing trace passes as the straight line segment, the process proceeds to step S103 and otherwise, the process proceeds to step S105. In step S103, the via in the closest vicinity of such straight line segment of the existing trace is located.

In step S104, with respect to the existing trace having a segment passing between the vias, between the obstacles or between the via and the obstacle adjacent to each other, an equiangular octagon circumscribing a circle that is centered on a center position of the via or the obstacle existing at the closest position to or, in the closest vicinity of, such segment and that is tangent to such segment is set so that one side of such equiangular octagon is in parallel with the predetermined reference line. Here, also in this case, it is to be noted that the equiangular octagon circumscribing the circle is a regular octagon.

FIGS. 9A and 9B are diagrams for describing the equiangular octagon that is set with respect to the existing trace having the segment passing between the vias that are adjacent to each other in the embodiment of the present invention. Here, as shown in FIG. 9A, it is assumed that the straight existing trace W passes between the vias V1 and V2. At this time, as shown in FIG. 9B, among the vias V1 and V2, the via V1 exists at the closest position to or, in the closest vicinity of the straight line segment of the existing trace W. Therefore, the equiangular octagon H1 is set so that the equiangular octagon H1 circumscribes the circle E1 centered on the center position of the via V1 and tangent to such straight line segment and so that one side of the equiangular octagon H1 is in parallel with the contour line R of the semiconductor package.

Returning to FIG. 7A, in step S105, it is determined whether the segment of such existing trace forms an angle from 45 to 135 degrees with the predetermined reference line or not at an intersection point of such equiangular octagon and the existing trace when the segment of the existing trace intersects the equiangular octagon corresponding to such existing trace. The process of step S105 is performed on both the equiangular octagons set in step S101 and the equiangular octagon set in step S104.

If it is determined that the segment of such existing trace forms an angle from 45 to 135 degrees in step S105, the process proceeds to step S106. In step S106, among sides of the equiangular octagon that is set to correspond to the segment of such existing trace, a side in the direction of 90 degrees with respect to the predetermined reference line in the neighborhood of an intersection point of the segment of such existing trace and such equiangular octagon is selected.

On the other hand, if it is determined that the segment of such existing trace does not form an angle from 45 to 135 degrees in step S105, the process proceeds to step S112. It means that, when the segment of the existing trace intersects the equiangular octagon corresponding to such existing trace, the segment of such existing trace forms an angle from 0 to 45 degrees or from 135 to 180 degrees with the predetermined reference line at the intersection point of such equiangular octagon and the existing trace. In step S112, among the sides of the equiangular octagon that is set to correspond to the segment of such existing trace, a side in the direction of 45 degrees or a side in the direction of 135 degrees with respect to the predetermined reference line in the neighborhood of the intersection point of the segment of such existing trace and such equiangular octagon is selected.

Figure 10A:
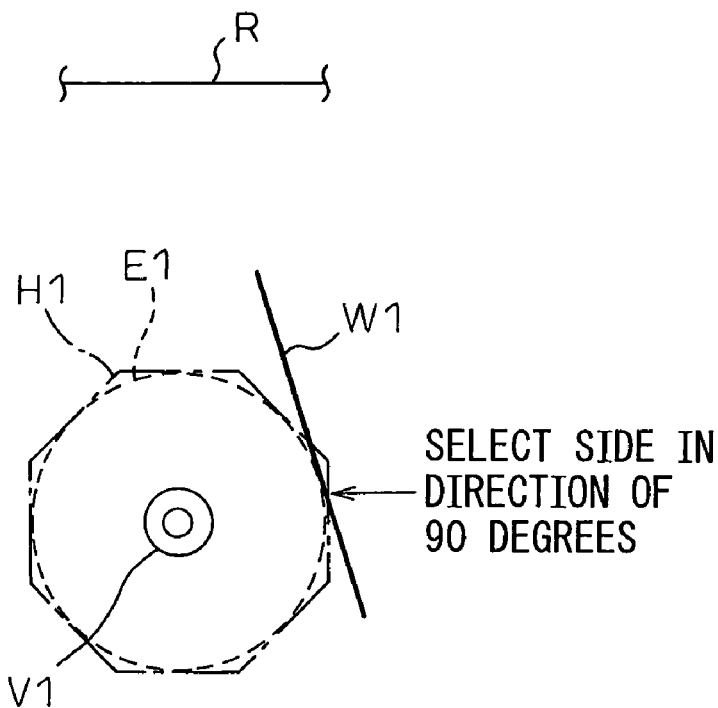
FIGS. 10A and 10B are diagrams for describing determination of an angle with respect to a predetermined reference line when a segment in an existing trace intersects an equiangular octagon corresponding to such existing trace, and accompanying selection of a side of the equiangular octagon in an embodiment of the present invention.
Figure 10B:
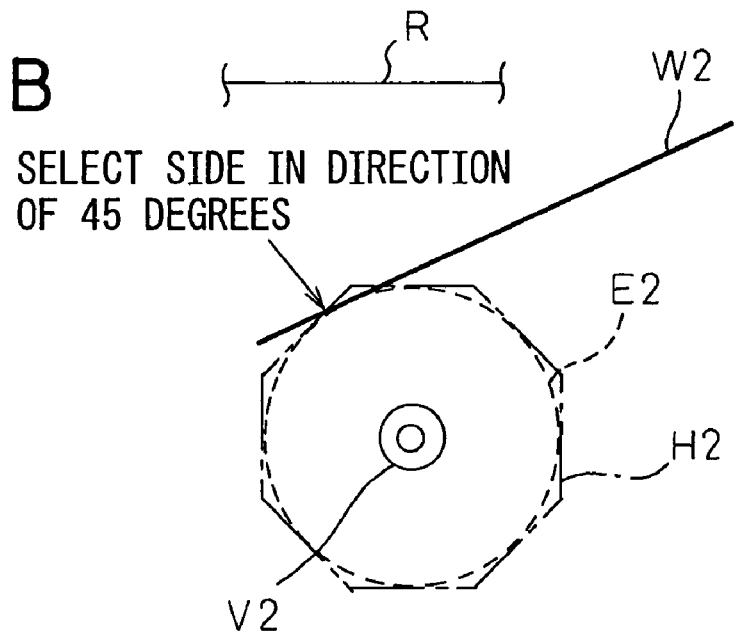

FIGS. 10A and 10B are diagrams for describing determination of the angle with respect to the predetermined reference line when the segment in the existing trace intersects the equiangular octagon corresponding to such existing trace, and accompanying selection of the side of the equiangular octagon in the embodiment of the present invention. Thus, FIGS. 10A and 10B show a specific example of the process in the steps S105, S106 and S112 described above. In the example shown in FIG. 10A, when the existing trace W1 intersects the corresponding equiangular octagon H1, the existing trace W1 also intersects the contour R of the semiconductor package at an angle from 45 to 135 degrees. Therefore, a side of the equiangular octagon H1 in the direction of 90 degrees is selected. On the other hand, in the example shown in FIG. 10B, when the existing trace W2 intersects the corresponding equiangular octagon H2, the existing trace W2 also intersects the contour R of the semiconductor package at an angle from 0 to 45 degrees. Therefore, a side of the equiangular octagon H2 in the direction of 45 degrees is selected.

Returning to FIG. 7B, in step S107, the side in the direction of 90 degrees selected in step S106 is extended or shortened by a predetermined length as necessary. The purpose of extending or shortening the selected side in the direction of 90 degrees is to satisfy requirements for clearance as described below or to allow the user to arbitrarily set such predetermined length. Therefore, in step S107, the selected side in the direction of 90 degrees may not be changed. Next, in step S108, two sides in the direction of 90 degrees, which are two segments obtained in step S107 based on two equiangular octagons adjacent to each other substantially in the disposing direction of the existing trace, are connected with each other by a segment in the direction of 45 or 135 degrees with respect to the predetermined reference line. Then, the trace after the correction is set so that it overlaps the selected sides in the direction of 90 degrees and the segment in the direction of 45 or 135 degrees to connect these sides.

Figure 11A:
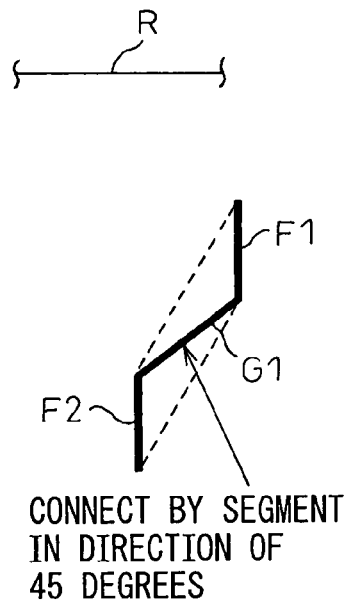
FIGS. 11A-11C are diagrams for describing connection between two sides in the direction of 90 degrees in an embodiment of the present invention.
Figure 11B:
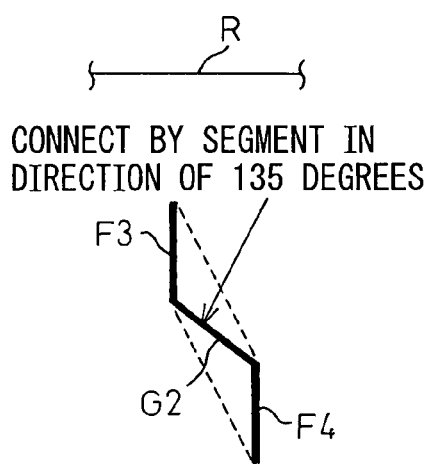
Figure 11C:
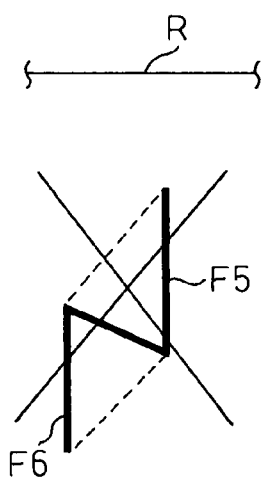

FIGS. 11A-11C are diagrams for describing the connection between the two sides in the direction of 90 degrees in the embodiment of the present invention. Thus, FIGS. 11A-11C show a specific example of the process in the step S108 described above. The side F1 in the direction of 90 degrees and the side F2 in the direction of 90 degrees are connected by the segment G1 in the direction of 45 degrees with respect to the contour R of the semiconductor package as shown in FIG. 11A, or the side F3 in the direction of 90 degrees and the side F4 in the direction of 90 degrees are connected by the segment G2 in the direction of 135 degrees with respect to the contour R of the semiconductor package as shown in FIG. 11B. Whether the connection is made by the segment in the direction of 45 degrees or the segment in the direction of 135 degrees depends on a positional relationship between the sides in the direction of 90 degrees of the two equiangular octagons. However, when the side F5 in the direction of 90 degrees and the side F6 in the direction of 90 degrees overlap each other substantially in the direction of the trace as shown in FIG. 11C, the connection is not made at first but it is made after any one or both of the side F5 in the direction of 90 degrees and the side F6 in the direction of 90 degrees of the two equiangular octagons are shortened.

Returning to FIG. 7A, in step S113, the side in the direction of 45 or 135 degrees selected in step S112 is extended or shortened by a predetermined length as necessary. The purpose of extending or shortening the selected side in the direction of 45 or 135 degrees is described above in relation to step S107. In step S113, the selected side in the direction of 45 or 135 degrees may not be changed. Next, in step S114, two sides in the direction of 90 degrees, which are two segments obtained in step S113 based on two equiangular octagons adjacent to each other substantially in the disposing direction of the existing trace, are connected with each other by a segment in the direction of 90 degrees with respect to the predetermined reference line. Then, the trace after the correction is set so that it overlaps the selected sides in the direction of 45 or 135 degrees and the segment in the direction of 0 or 90 degrees to connect these sides.

Figure 12A:
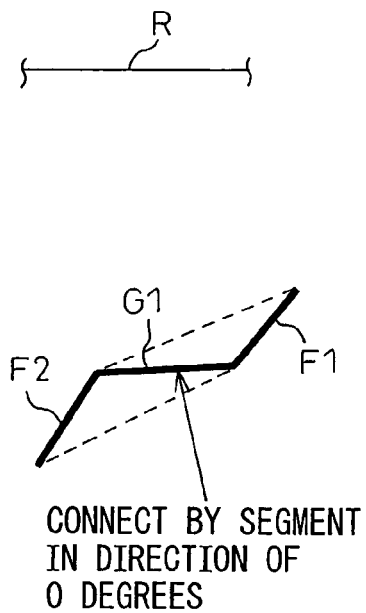
FIGS. 12A-12C are diagrams for describing connection between two sides in the direction of 45 or 135 degrees in an embodiment of the present invention.
Figure 12B:
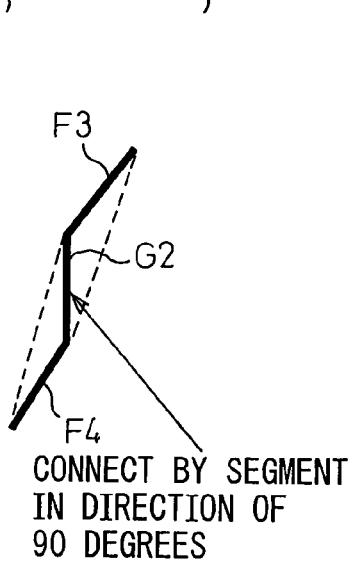
Figure 12C:
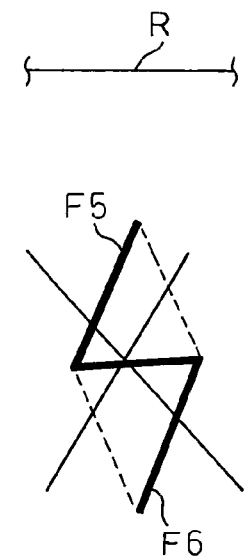

FIGS. 12A-12C are diagrams for describing the connection between the two sides in the direction of 45 or 135 degrees in the embodiment of the present invention. Thus, FIGS. 12A-12C show a specific example of the process in the step S114 described above and, here, as an example, the connection between two sides in the direction of 45 degrees will be described. The side F1 in the direction of 45 degrees and the side F2 in the direction of 45 degrees are connected by the segment G1 in the direction of 0 degrees with respect to the contour R of the semiconductor package as shown in FIG. 12A, or the side F3 in the direction of 45 degrees and the side F4 in the direction of 45 degrees are connected by the segment G2 in the direction of 90 degrees with respect to the contour R of the semiconductor package as shown in FIG. 12B. Whether the connection is made by the segment in the direction of 0 degrees or the segment in the direction of 90 degrees depends on a positional relationship between the sides in the direction of 45 degrees of the two equiangular octagons. However, when the side F5 in the direction of 45 degrees and the side F6 in the direction of 45 degrees overlap each other substantially in the direction of the trace as shown in FIG. 12C, the connection is not made at first but it is made after any one or both of the sides in the direction of 45 degrees of the two equiangular octagons are shortened.

Returning to FIG. 7A, in step S109, with respect to the trace after the correction that is obtained by correcting the position of the existing trace so as to overlap the selected sides in the direction of 90 degrees and the segment in the direction of 45 or 135 degrees to connect these sides, it is inspected whether clearance between such trace and the other traces, the vias or the obstacles adjacent to such trace can be secured or not. If the clearance can be secured, the process terminates. If the clearance cannot be secured, in order to at least secure the clearance, the segment in the direction of 45 or 135 degrees is offset in step S110 and the sides in the direction of 90 degrees are extended or shortened in step S112. Here, the offset of the segment in the direction of 45 or 135 degrees in step S110 means that the segment in the direction of 45 or 135 degrees is translated substantially in the direction of the trace.

On the other hand, in step S115, with respect to the trace after the correction that is obtained by correcting the position of the existing trace so as to overlap the selected sides in the direction of 45 or 135 degrees and the segment in the direction of 0 or 90 degrees to connect these sides, it is inspected whether clearance between such trace and the other traces, the vias or the obstacles adjacent to such trace can be secured or not. If the clearance can be secured, the process terminates. If the clearance cannot be secured, in order to at least secure the clearance, the segment in the direction of 0 or 90 degrees is offset in step S116 and the sides in the direction of 45 or 135 degrees are extended or shortened in step S117. Here, the offset of the segment in the direction of 0 or 90 degrees in step S116 means that the segment in the direction of 0 or 90 degrees is translated substantially in the direction of the trace.

Figure 13A:
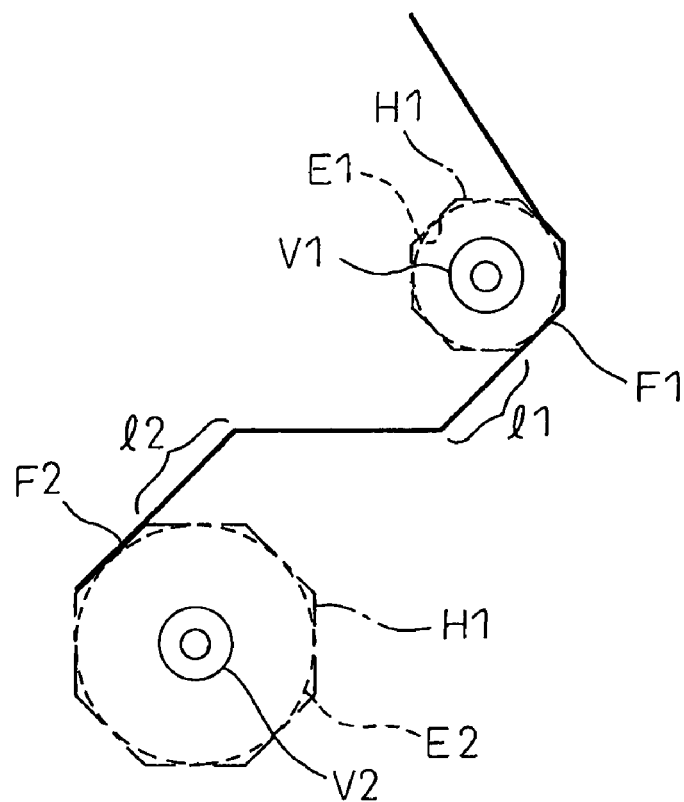
FIGS. 13A and 13B are diagrams for describing extension and shortening of sides of two equiangular octagons in an embodiment of the present invention.
Figure 13B:
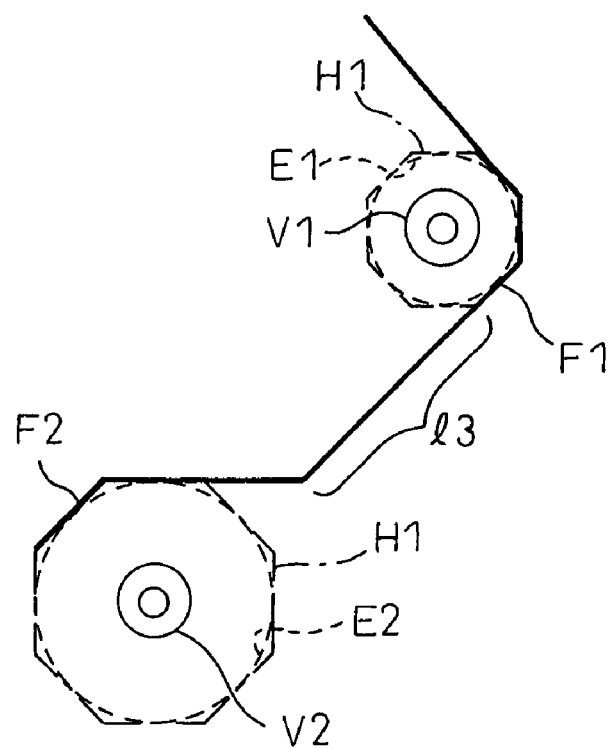

FIGS. 13A and 13B are diagrams for describing the extension and the shortening of the sides of the two equiangular octagons in the embodiment of the present invention. The selected sides of the equiangular octagons are extended or shortened when the position of the existing trace is corrected so as to overlap the selected sides and the segment to connect these sides as described above but the clearance between the trace after the correction and the adjacent other traces, the vias or the obstacles cannot be secured, or the user may arbitrarily extend or shorten the sides of the equiangular octagons. In the example shown in FIG. 13A, the side F1 of the equiangular octagon E1 in the direction of 45 degrees is extended by 11 and the side F2 of the equiangular octagon E2 in the direction of 45 degrees is extended by 12; on the other hand, in the example shown in FIG. 13B, the side F1 of the equiangular octagon E1 in the direction of 45 degrees is extended by 13 but the side F2 of the equiangular octagon E2 in the direction of 45 degrees is not extended.

Figure 14:
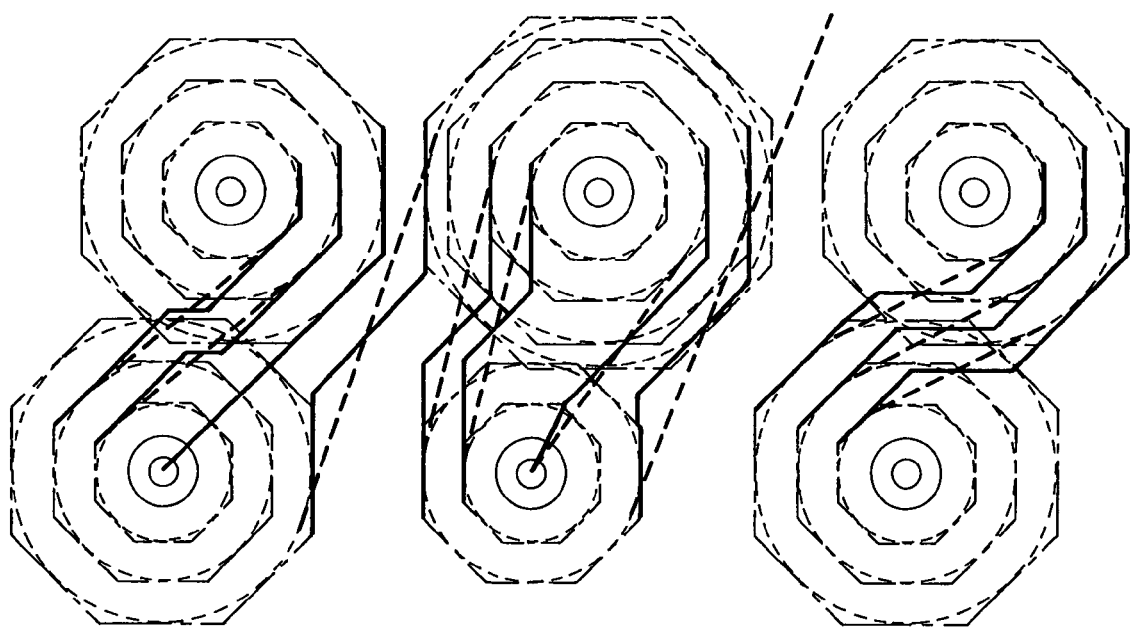
FIG. 14 is a diagram for illustrating a result of an automatic trace shaping process according to an embodiment of the present invention.

FIG. 14 is a diagram for illustrating a result of the automatic trace shaping process according to the embodiment of the present invention. In the figure, the existing traces are indicated by thick dotted lines and the traces after the correction are indicated by thick solid lines. Here is shown that the existing traces are corrected differently depending on the angles of the segments of the existing traces with respect to the contour R of the semiconductor package when the segments of the existing traces intersect the equiangular octagons corresponding to each existing trace as described above.

Figure 15:
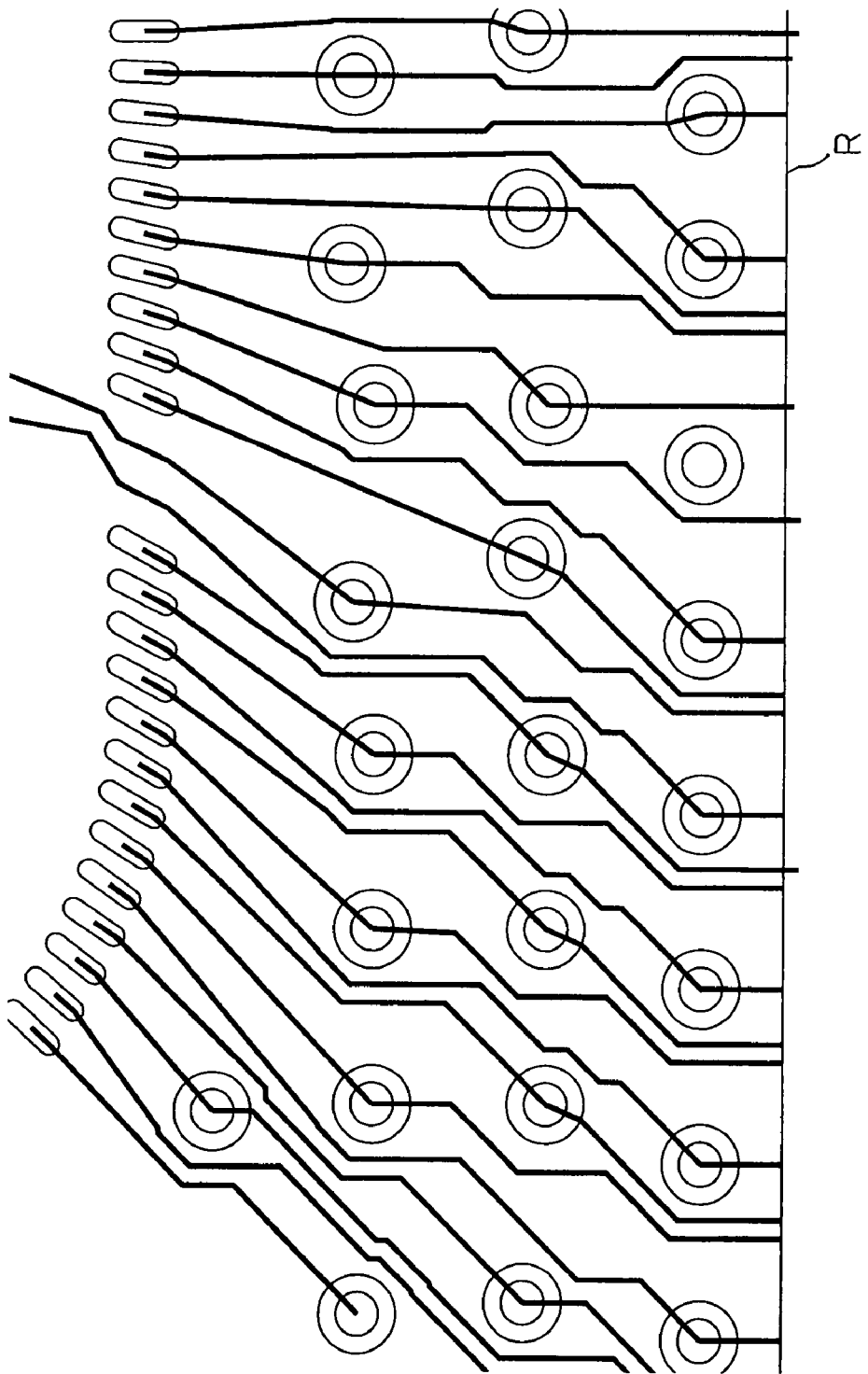
FIG. 15 is a diagram showing a result of applying an automatic trace shaping process according to an embodiment of the present invention to the existing traces consisting of the straight and/or curved lines that are designed to be disposed in the arbitrary directions on the surface of the substrate of the semiconductor package shown in FIG. 5.

By performing the series of processes described above for each existing trace, all the existing traces consisting of the straight and/or curved lines that are designed to be disposed in the arbitrary directions on the surface of the substrate of the semiconductor package can be shaped into the traces each consisting of the combination of the segments in the direction of the angles of "45×n" degrees (where n is an integer) with respect to the predetermined reference line (the so called "45-degree traces"). FIG. 15 is a diagram showing a result of applying the automatic trace shaping process according to the embodiment of the present invention to the existing traces consisting of the straight and/or curved lines that are designed to be disposed in the arbitrary directions on the surface of the substrate of the semiconductor package shown in FIG. 5. Here is shown that the existing traces consisting of the straight and/or curved lines that are designed to be disposed in the arbitrary directions are shaped into the "45-degree traces".

Here, it is to be noted that the equiangular octagons are used to shape the existing traces consisting of the straight and/or curved lines that are designed to be disposed in the arbitrary directions into the traces each consisting of the combination of the segments in the directions of the angles of "45×n" degrees (where n is an integer) with respect to the predetermined reference line (the so-called "inclined 45-degree traces") in the embodiment of the present invention. As a variant to this, for example, equiangular hexadecagons (16-gons) may be used to shape the existing traces consisting of the straight and/or curved lines that are designed to be disposed in the arbitrary directions into traces each consisting of a combination of segments in directions of "22.5×n" degrees (where n is an integer) with respect to the predetermined reference line (the "inclined 22.5-degree traces"). Here, the equiangular hexadecagons are used because all interior angles of the equiangular hexadecagons are 157.5 degrees and, if each trace is set so as to overlap any side of the equiangular hexadecagons, the traces will always be oriented in the directions of "22.5×n" degrees (where n is an integer). Further, for example, equiangular 32-gons may be used to shape the existing traces into traces each consisting of a combination of segments in directions of "11.25×n" degrees (where n is an integer) (the "inclined 11.25-degree traces). Still further, for example, equiangular dodecagons may be used to shape the existing traces into traces each consisting of a combination of segments in directions of "60×n" degrees (where n is an integer) (the "inclined 60-degree traces"). As described above, traces each consisting of segments in the desired directions can be implemented easily by setting equiangular polygons according to directions of the traces.

Further, the present invention can be applied to any existing traces consisting of straight and/or curved lines that are designed to be disposed in arbitrary directions no matter by what method the existing traces are designed in advance. For example, the present invention can be applied to traces designed based on the invention as set forth in Japanese Unexamined Patent Publication No. 2002-083006 by restoring circles from "circular arcs generated around vias based on design rules" to set equiangular octagons.

The automatic trace shaping apparatus according to this embodiment as described above is implemented by using a computer. FIG. 16 is a block diagram showing a configuration of the automatic trace shaping apparatus of the embodiment of the present invention that operates according to a program that is stored on a storage medium.

As shown in FIG. 16, a program for allowing a computer to perform automatic trace shaping according to the present invention is stored on a storage medium (an external storage medium such as a flexible disk, a CD-ROM, a CD-R, a CD-RW, a DVD and the like) 110 and, for example, it is installed in a computer configured as described below to operate as the automatic trace shaping apparatus.

A CPU 111 controls the automatic trace shaping apparatus entirely. This CPU 111 is connected with a ROM 113, a RAM 114, a HD (hard disk drive) 115, an input device 116 such as a mouse, a keyboard and the like, an external storage medium drive 117, and a display device 118 such as a LCD, a CRT, a plasma display, an organic EL and the like through a bus 112. A control program for the CPU 111 is stored in the ROM 113.

The program for performing the automatic trace shaping process according to the present invention (an automatic trace shaping process program) is installed (stored) from the storage medium 110 on the HD 115. Further, in the RAM 114, a working area for the CPU 111 to perform the automatic trace shaping process and an area for storing a portion of the program for performing the automatic trace shaping process are secured. Moreover, in the HD 115, input data (for example, data about the existing traces designed to be disposed in the arbitrary directions), final data (for example, data about the traces after the correction according to the present invention) and, further, an OS (operating system) and the like are stored in advance.

First, when the computer is turned on, the CPU 111 reads the control program from the ROM 110 and, further, reads the OS from the HD 115 to start the OS. As a result, the computer is ready to install the automatic trace shaping process program from the storage medium 110.

Next, the storage medium 110 is mounted on the external storage medium drive 117 and a control command is input from the input device 116 to the CPU 111 to read the automatic trace shaping process program stored in the storage medium 110 and store it in the HD 115 and the like. Thus, the automatic trace shaping process program is installed on the computer.

After that, once the automatic trace shaping process program is activated, the computer operates as the automatic trace shaping apparatus. An operator can perform the automatic trace shaping process described above by manipulating the input device 116 according to working details and procedures through an interaction indicated on the display device 118. "Data about the traces after the correction" obtained as a result of the process may be, for example, stored on the HD 115 for utilization in the future, or may be used to indicate the results of the process on the display device 118 visually.

Here, though the program stored in the storage medium 110 is installed on the HD 115 in the computer of FIG. 16, the present invention is not limited to such implementation and the program may be installed on the computer through an information transmission medium such as a LAN and the like or the program may be installed in advance in the HD 115 built in the computer.

The present invention can be applied to product design of various semiconductor packages such as CSP (Chip scale packages), PBGA (Plastic ball grid arrays), EBGA (Enhanced ball grid arrays) and the like.

According to the present invention, a process for shaping existing traces consisting of straight and/or curved lines that are designed to be disposed in arbitrary directions on a surface of a substrate of a semiconductor package into traces each consisting of a combination of segments in directions of specific angles (for example, "45×n" degrees, where n is an integer) with respect to a predetermined reference line can be performed automatically in a short time by computer computation. Therefore, according to the present invention, traces can be changed into those of stable quality in a short time readily without being influenced by the designer's skill, experience, intuition and the like as in the related art. For example, according to the present invention, the computation result, which was obtained by taking about 3-10 days in the related-art manual trace design by trial and error, can be obtained automatically within about half a day to 2 days. The need of the manual trace design by trial and error as in the related art can be eliminated and, therefore, even if more complicated traces are required, the traces of high quality can be implemented in a short time. As a result of the reduction of design time and the burden on the designer, manufacturing costs of semiconductor packages can also be reduced.

There is no compatibility between trace design data designed by the CAD for semiconductor packages and that designed by the CAD for the LSI, however, according to the present invention, the trace design data designed by the CAD for the semiconductor packages can be automatically changed into the trace design data that can be used for the CAD for the LSI. Therefore, the need to redesign the traces that have been completed for the semiconductor packages so that the trace design can be utilized also in the CAD for the LSI as in the related art can be avoided. Further, according to the present invention, also in the semiconductor packages having a high trace density, the 45-degree traces can be implemented easily.

What is claimed is:

1. A method of automatically shaping existing traces including straight and/or curved lines that are designed to be disposed in arbitrary directions on a surface of a substrate of a semiconductor package into traces each including a combination of segments in directions of "45×n" degrees (where n is an integer) with respect to a predetermined reference line the method comprising:
    using a computer processor,
        setting equiangular octagons having sides in parallel with said predetermined reference line; and
        shaping said existing traces by correcting positions of said existing traces so that each existing trace overlaps any side of the set equiangular octagons.

2. A method according to claim 1, wherein in the setting of the equiangular octagons, said equiangular octagons are set so that each equiangular octagon circumscribes a clearance circle indicating a position where clearance is securable from vias or obstacles.

3. A method according to claim 1, wherein in the setting of the equiangular octagons, said equiangular octagons are set so that, with respect to the existing trace having a segment passing between the vias, between the obstacles or between the via and the obstacle adjacent to each other, each equiangular octagon circumscribes a circle that is centered on a center position of the via or the obstacle existing at the closest position to such segment and that is tangent to such segment.

4. A method according to claim 1, wherein in the setting of the equiangular octagons, said predetermined reference line is one of four contour sides of said semiconductor package from which said existing traces to be shaped are drawn out.

5. An apparatus for automatically shaping existing traces including straight and/or curved lines that are designed to be disposed in arbitrary directions on a surface of a substrate of a semiconductor package into traces each including a combination of segments in directions of "45×n" degrees (where n is an integer) with respect to a predetermined reference line comprising:
    first setting means for setting an equiangular octagon circumscribing a clearance circle indicating a position where clearance is securable from vias or obstacles, so that one side of the equiangular octagon is in parallel with said predetermined reference line;
    second setting means for setting, with respect to the existing trace having a segment passing between the vias, between the obstacles or between the via and the obstacle adjacent to each other, an equiangular octagon circumscribing a circle that is centered on a center position of the via or the obstacle existing at closest position to such segment and that is tangent to such segment, so that one side of the equiangular octagon is in parallel with said predetermined reference line;
    first correction means for correcting said existing trace in a vicinity of said via or said obstacle by obtaining segments so that the trace overlaps any side of said equiangular octagon set by said first setting means or said second setting means with respect to such via or obstacle; and
    second correction means for connecting two of the segments obtained when said first correction means corrects said existing trace based on equiangular octagons adjacent to each other substantially in a disposing direction of said existing trace by each segment in a direction of "45×n" degrees (where n is an integer) with respect to said predetermined reference line,
    wherein the trace including a combination of said two segments obtained by said first correction means and said segment in the direction of "45×n" degrees (where n is an integer) obtained by said second correction means is determined as the trace after the correction.

6. An apparatus according to claim 5, wherein said first correction means comprises:
    determination means for determining whether the segment of said existing trace intersecting a corresponding set equiangular octagon forms an angle from 45 to 135 degrees with said predetermined reference line, at an intersection point of the corresponding equiangular octagon and said existing trace; and
    selection means that, when said determination means determines that the segment of said existing trace forms the angle from 45 to 135 degrees, selects, among sides of said corresponding equiangular octagon , a side in a direction of 90 degrees with respect to said predetermined reference line in a neighborhood of the intersection point of the segment of such existing trace and said corresponding equiangular octagon or, otherwise, selects, among the sides of said corresponding equiangular octagon, a side in a direction of 45 degrees or a side in a direction of 135 degrees with respect to said predetermined reference line in the neighborhood of the intersection point of the segment of such existing trace and said equiangular octagon, wherein the segments overlapping the side selected by said selection means are determined as said two segments obtained by said first correction means.

7. An apparatus according to claim 6, wherein said first correction means further comprises changing means for extending or shortening the side selected by said selection means by a predetermined length and wherein the segments overlapping the sides extended or shortened by such changing means are determined as said two segments obtained by said first correction means.

8. An apparatus according to claim 7, further comprising:

clearance inspection means for inspecting, with respect to the trace after the correction determined by said first correction means and said second correction means, whether clearance from the other traces, the vias or the obstacles adjacent to such trace is securable; and offset means for further correcting, when said clearance inspection means determines that said clearance is not securable with respect to the trace after the correction determined by said first correction means and said second correction means, a position of said trace after the correction so that at least said clearance is secured.

9. An apparatus according to claim 8, wherein said offset means further corrects the position of said trace after the correction so that said clearance is secured by adjusting lengths of said side by said changing means.

10. An apparatus according to claim 5, wherein said predetermined reference line is one of four contour sides of said semiconductor package from which said existing traces to be shaped are drawn out.

11. An apparatus according to claim 5, wherein said existing traces are those with respect to which the clearance is secured from the other existing traces, the vias or the obstacles adjacent to such existing traces.

* * * * *